United States Patent
Kräuter

(10) Patent No.: US 8,581,288 B2
(45) Date of Patent: Nov. 12, 2013

(54) LIGHT-EMITTING DIODE AND METHOD FOR PRODUCING A LIGHT-EMITTING DIODE

(75) Inventor: Gertrud Kräuter, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/382,313

(22) PCT Filed: Jun. 29, 2010

(86) PCT No.: PCT/EP2010/059217
§ 371 (c)(1),
(2), (4) Date: Feb. 15, 2012

(87) PCT Pub. No.: WO2011/006754
PCT Pub. Date: Jan. 20, 2011

(65) Prior Publication Data
US 2012/0132947 A1    May 31, 2012

(30) Foreign Application Priority Data
Jul. 15, 2009    (DE) .......................... 10 2009 033 287

(51) Int. Cl.
*H01L 33/60* (2010.01)
(52) U.S. Cl.
USPC .......................................................... 257/98
(58) Field of Classification Search
USPC ................................................... 257/98, 79
See application file for complete search history.

(56) References Cited

U.S. PATENT DOCUMENTS

| | | | |
|---|---|---|---|
| 5,834,528 A | 11/1998 | Tanaka et al. | |
| 2003/0214695 A1* | 11/2003 | Abramson et al. | 359/265 |
| 2004/0032728 A1* | 2/2004 | Galli | 362/84 |
| 2006/0275882 A1 | 12/2006 | Martinez-Gutierrez et al. | |
| 2008/0062688 A1 | 3/2008 | Aeling et al. | |
| 2008/0237619 A1* | 10/2008 | Epler et al. | 257/98 |
| 2010/0165660 A1* | 7/2010 | Weber et al. | 362/609 |
| 2011/0051047 A1* | 3/2011 | O'Neill et al. | 349/67 |
| 2011/0096529 A1* | 4/2011 | Wheatley et al. | 362/97.1 |

FOREIGN PATENT DOCUMENTS

| | | |
|---|---|---|
| DE | 11 2006 001 539 T5 | 4/2008 |
| JP | 2009-032943 A | 2/2009 |
| WO | 96/21168 A1 | 7/1996 |
| WO | 03/038912 A2 | 5/2003 |
| WO | 2005/093853 A1 | 10/2005 |
| WO | 2006/048064 A1 | 5/2006 |
| WO | 2007/027539 A1 | 3/2007 |
| WO | 2009/075530 A2 | 6/2009 |

OTHER PUBLICATIONS

"Laser Cavities,"*ElringKlinger Kunststoftechnik*, 1 page from website: www.elringklinger-kunststoff.de, 1 page with English Abstract and Technical Data.

(Continued)

*Primary Examiner* — Thao P. Le
(74) *Attorney, Agent, or Firm* — DLA Piper LLP (US)

(57) ABSTRACT

A light-emitting diode includes a carrier having a mounting surface; at least one light-emitting diode chip fixed to the mounting surface; and a reflective element provided for reflecting electromagnetic radiation, wherein the reflecting element is fixed to the carrier and includes porous polytetrafluoroethylene.

14 Claims, 3 Drawing Sheets

(56) References Cited

OTHER PUBLICATIONS

Braun, H. et al., "Makrofol® (PC); Bayfol® (PC + PBT) Film: In-Mould Decoration," *Application Technology Information*, from website: www.plastics.bayer.com, Sep. 1999, cover and 7 pages.

Metzger, H., "Porous PTFE Brought to Shape," *ElringKlinger Kunstsofftechnik*, Oct. 2002, from website:www.elringklinger-kunststoff.de, 2 pages and 3 pages of English translation.

"Porous PTFE (Polytetraflourethylene) as Reflectance Standard," *SphereOptics*, from website: www.sphereoptics.com, 1 page.

\* cited by examiner

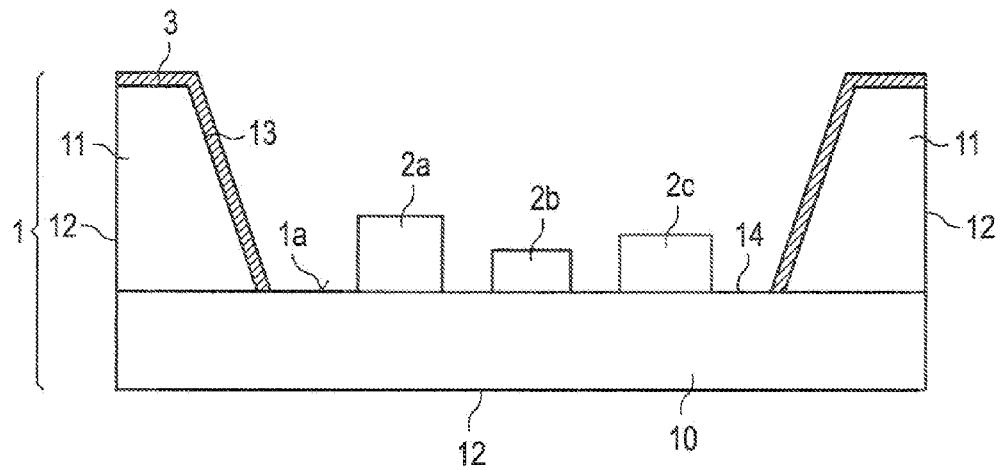
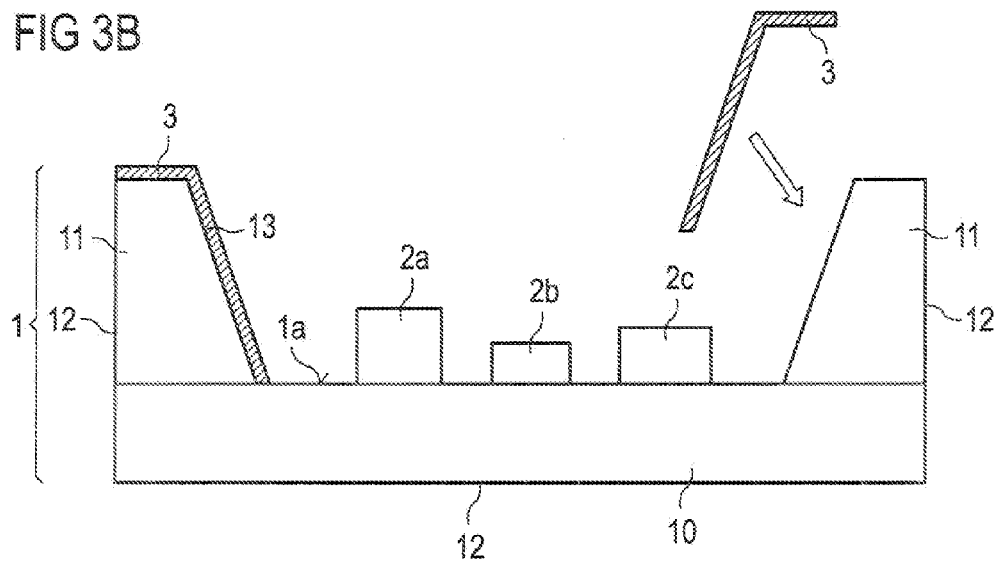

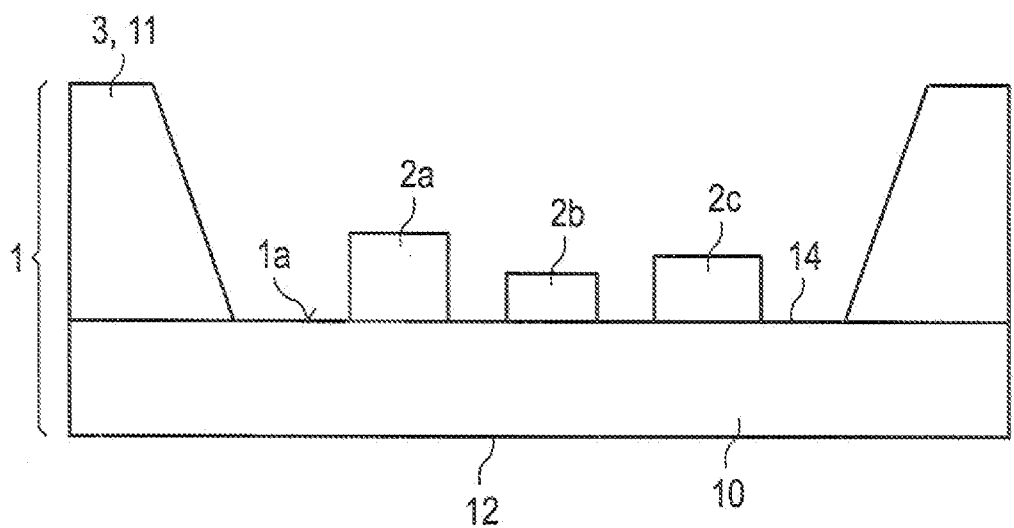

LIGHT-EMITTING DIODE AND METHOD FOR PRODUCING A LIGHT-EMITTING DIODE

RELATED APPLICATIONS

This is a §371 of International Application No. PCT/EP2010/059217, with an international filing date of Jun. 29, 2010 (WO 2011/006754, published Jan. 20, 2011), which is based on German Patent Application No. 10 2009 033 287.1, filed Jul. 15, 2009, the subject matter of which is incorporated by reference.

TECHNICAL FIELD

This disclosure relates to a light-emitting diode and a method for producing a light-emitting diode.

BACKGROUND

U.S. Pat. No. 5,834,528 describes the production of a foil composed of porous polytetrafluoroethylene.

SUMMARY

I provide a light-emitting diode including a carrier having a mounting surface, at least one light-emitting diode chip fixed to the mounting surface, and a reflective element provided for reflecting electromagnetic radiation, wherein the reflective element is fixed to the carrier and includes porous polytetrafluoroethylene.

I also provide a method for producing the light-emitting diode, wherein the carrier includes a thermoplastic at least in places and the reflective element is pressed onto the plastic, with melting of the plastic to be fixed to the carrier in a manner free of bonding agent.

I further provide a method for producing the light-emitting diode, wherein the carrier includes a thermoplastic at least in places and the reflective element is insert-molded with the plastic to fix the reflective element to the carrier in a manner free of bonding agent.

I still further provide a light-emitting diode including a carrier having a mounting surface, at least one light-emitting diode chip fixed to the mounting surface, and a reflective element provided for reflecting electromagnetic radiation, wherein the reflective element is fixed to the carrier, the reflective element includes porous polytetrafluoroethylene, the reflective element is a rigid insert part consisting of porous polytetrafluoroethylene and is fixed to a reflector wall of the carrier, wherein the reflector wall laterally surrounds the at least one light-emitting diode chip, and the reflective element is fixed to the carrier at least in places in a manner free of bonding agent.

BRIEF DESCRIPTION OF THE DRAWINGS

FIGS. 1 to 4 show examples of light-emitting diodes described here in schematic sectional illustration.

DETAILED DESCRIPTION

Figure 1:
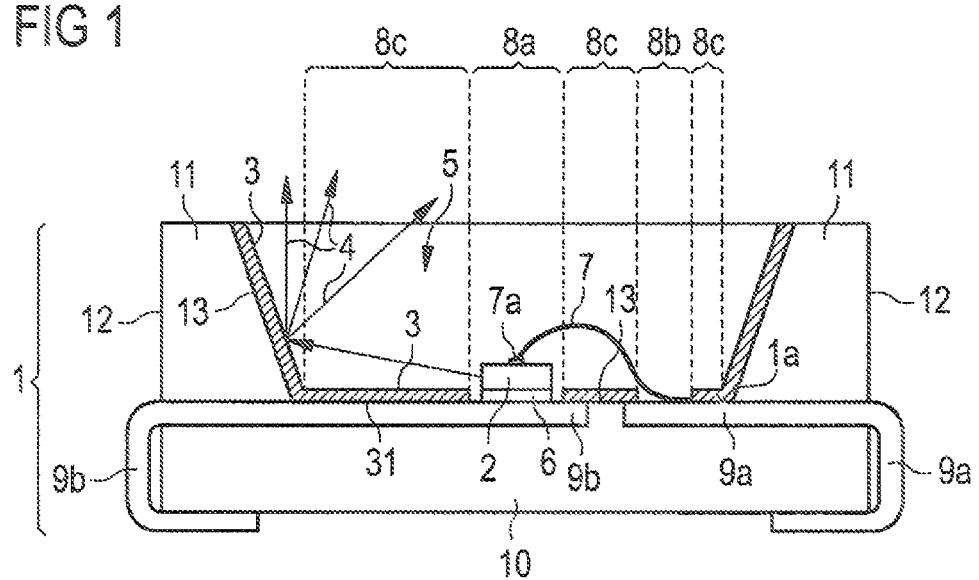

My light-emitting diode may comprise a carrier having a mounting surface. The carrier can be a connection carrier, for example, which has a basic body composed of an electrically insulating material, into or onto which electrical connection locations and conductor tracks are structured. The carrier can then additionally comprise at least one optical element such as a reflector wall, for example, which laterally surrounds the mounting surface. Furthermore, it is possible for the carrier to be a housing formed at least in places from an electrically insulating material. The housing can have a cavity in which the mounting surface is arranged. Electrical connection locations can project from the housing such that the carrier is suitable for SMT mounting, for example. The light-emitting diode is surface-mountable in this case.

The light-emitting diode may comprise at least one light-emitting diode chip fixed to the mounting surface of the carrier. The light-emitting diode can comprise, for example, at least one light-emitting diode chip suitable for emitting electromagnetic radiation in the spectral range of UV radiation and/or blue light. Furthermore, it is possible for the light-emitting diode to comprise different light-emitting diode chips each suitable for generating electromagnetic radiation in different spectral ranges. Thus, the light-emitting diode can comprise, for example, at least one light-emitting diode chip which emits green light, at least one light-emitting diode chip which emits blue light and at least one light-emitting diode chip which emits red light. The light-emitting diode chips can be fixed on the mounting surface of the carrier by soldering, for example, and are electrically conductively connected to electrical connection locations of the carrier.

The light-emitting diode may comprise a reflective element provided for reflecting electromagnetic radiation. The electromagnetic radiation can be, for example, electromagnetic radiation generated by at least one light-emitting diode chip during operation. Furthermore, the electromagnetic radiation can be radiation emitted by a luminescence conversion material, for example. In this case, radiation of the luminescence conversion material is preferably excited by the electromagnetic radiation of the at least one light-emitting diode chip of the light-emitting diode. The reflective element is provided, for example, to diffusely reflect the impinging electromagnetic radiation. That is to say that directional reflection of the electromagnetic radiation does not take place by the reflective element. Rather, the electromagnetic radiation is scattered away diffusely from the reflective element. By way of example, the reflective element is a reflector having a Lambertian emission characteristic.

The reflective element may comprise porous polytetrafluoroethylene. Porous polytetrafluoroethylene is distinguished by a high reflectivity of at least 98% in the spectral range of UV radiation, through visible light as far as infrared radiation. The reflective element is therefore particularly well suited to reflecting different electromagnetic radiation of different light-emitting diode chips. Therefore, alongside light-emitting diode chips which emit visible light, the light-emitting diode can, for example, also comprise light-emitting diode chips which emit UV radiation or infrared radiation. This non-visible radiation, too, is reflected preferably non-directionally by the reflective element comprising porous polytetrafluoroethylene.

The light-emitting diode may comprise a carrier having a mounting surface, at least one light-emitting diode chip fixed to the mounting surface, and a reflective element provided for reflecting electromagnetic radiation, wherein the reflective element is fixed to the carrier, and the reflective element comprises porous polytetrafluoroethylene.

The porous polytetrafluoroethylene used for the reflective element is distinguished, inter alia, by its high ageing stability with respect to UV-A radiation and blue light. The light-emitting diode is therefore particularly ageing-stable. Furthermore, the material can be used even at high continuous use temperatures of up to approximately 260° C. Briefly, that is to say for a few seconds up to one minute, the porous polytetrafluoroethylene withstands temperatures of up to approximately 300° C., which allows for particularly good solderability of the light-emitting diode.

The reflective element consists of a foil composed of porous polytetrafluoroethylene. The foil is preferably mechanically firmly fixed to the carrier. The foil is, for example, a parallelepipedal body whose extent in a lateral direction, that is to say parallel to the main direction of extent of the parallelepiped, is significantly greater than its thickness. The foil is prefabricated, that is to say that it is not produced together with the further components of the light-emitting diode, but rather is provided as a separate component before production of the light-emitting diode. The foil is flexible, that is to say pliable such that it can adapt to a mold (for example an injection mold for producing the carrier) in a positively locking manner.

The porous polytetrafluoroethylene, on account of its high melt viscosity, cannot be reshaped by known thermoplastic processing methods. Rather, the material is processed proceeding from a powder that is pressed and subsequently sintered. Shaping the material in a foil can be effected, for example, as in U.S. Pat. No. 5,834,528 cited above, or else by machining.

The reflective element may be a rigid insert part which consists of porous polytetrafluoroethylene and is fixed to a reflector wall of the carrier. That is to say that, in this instance, the reflective element is not a foil, but rather as a rigid, self-supporting body. In this case, the reflective element can be in a form and size such that it adjoins a reflector wall of the carrier in a positively locking manner.

In this case, the reflector wall laterally surrounds the at least one light-emitting diode chip with the result that it forms a cavity. Inner walls of the cavity face the at least one light-emitting diode chip. The reflective element can then, for example, be inserted into the cavity formed by the reflector wall and be fixed to the reflector wall.

The reflective element may be a reflector wall composed of porous polytetrafluoroethylene fixed to a baseplate of the carrier. In this case, the reflector wall laterally surrounds the at least one light-emitting diode chip of the light-emitting diode.

In this instance, the reflective element composed of porous polytetrafluoroethylene is a rigid, self-supporting body that forms a part of the carrier of the light-emitting diode. In this case, the reflector wall is fixed, for example, adhesively bonded, to another part of the carrier, for example, a baseplate of the carrier. For this purpose, the reflector wall composed of porous polytetrafluoroethylene can be produced by shape cutting, for example. That is to say that in this case, too, production by a thermoplastic processing method is not necessary.

The reflective element, which may consist, for example, of a foil composed of porous polytetrafluoroethylene, may be fixed to the carrier at least in places by an adhesive. "At least in places" means that the reflective element can be fixed to the carrier by an adhesive in the first region and is fixed to the carrier by a different fixing method in other regions. Furthermore, it is possible for the reflective element to be fixed to the carrier exclusively by an adhesive arranged between the reflective element and carrier.

The reflective element may be fixed to the carrier at least in places in a manner free of bonding agent. In this case, "at least in places" means that the reflective element can be fixed to the carrier in a manner free of bonding agent in first regions and is fixed to the carrier in a different way in second regions. By way of example, the reflective element can then be fixed to the carrier by an adhesive in the second regions. Furthermore, it is also possible for the reflective element to be fixed to the carrier exclusively in a manner free of bonding agent. The reflective element fixed in a manner free of bonding agent can be fixed by hot pressing or insert molding, for example, to regions of the carrier formed with a plastic. In other regions of the carrier which are possibly present and in which the carrier is formed with a metal, for example, the reflective element can then be fixed to the carrier by an adhesive.

The reflective element, that is to say, for example, the foil composed of porous polytetrafluoroethylene, may cover all the regions of the outer surface of the carrier on which electromagnetic radiation generated by at least one light-emitting diode chip during operation of the at least one light-emitting diode chip can impinge.

In other words, during operation of the at least one light-emitting diode chip, no electromagnetic radiation generated by the at least one light-emitting diode chip impinges on the outer surface of the carrier. The carrier can then be formed, for example, with a UV-sensitive material such as a cost-effective thermoplastic. In particular, the sensitive regions of the carrier which would age rapidly as a result of UV-A radiation or blue light, for example, are then covered by the reflective element consisting, for example, of a foil composed of porous polytetrafluoroethylene.

All the regions of the outer surface of the carrier which are formed with a plastic and on which electromagnetic radiation generated by the at least one light-emitting diode chip during the operation of the at least one light-emitting diode chip can impinge may be covered by the reflective element. Other regions of the carrier, which are then formed with a metal, for example, because, for instance, electrical connection locations of the light-emitting diode are situated there, can then remain uncovered by the reflective element. That is to say that, in this case, the reflective element only protects those regions of the carrier in which the outer surface of the carrier comprises a plastic intended to be protected against electromagnetic radiation. In other words, all the regions of the outer surface of the carrier which are free of a plastic can also be free of the reflective element.

Further, I provide a method for producing a light-emitting diode. Preferably, a light-emitting diode as described here can be produced by the method. That is to say that all features described for the light-emitting diode are also disclosed for the method, and vice versa.

In accordance with the method, a carrier is provided which comprises a thermoplastic at least in places. That is to say that the outer surface of the carrier is formed with a thermoplastic at least in places. The reflective element, which consists of a foil composed of porous polytetrafluoroethylene, for example, is pressed onto the plastic with melting of the plastic. That is to say that carrier and reflective element are connected to one another by hot pressing in a manner free of bonding agent. In other regions of the carrier in which the outer surface of the carrier is not formed with a plastic, the carrier can remain free of the reflective element or the reflective element is fixed to the carrier by an adhesive.

A carrier may be provided which comprises a thermoplastic at least in places. That is to say that at least locations of the outer surface of the carrier may be formed with a thermoplastic. The reflective element, that is to say, for example, the foil composed of porous polytetrafluoroethylene, may be insert-molded with the plastic to be fixed in a manner free of bonding agent to those locations of the carrier which are formed with the thermoplastic. The insert-molded plastic can then form those regions of the carrier whose outer surface are formed with the plastic. For this purpose, by way of example, the foil composed of porous polytetrafluoroethylene can be inserted into the mold of an injection mold and be insert-molded with the plastic. In this way, by way of example, it is possible to produce a light-emitting diode which has a plastic housing having a cavity for the light-emitting diode chips. The inner surfaces of the cavity or at least parts of the inner surfaces of the cavity are then covered with the reflective element, which is fixed to the plastic by insert molding.

The light-emitting diode and the method described here for producing a light-emitting diode are explained in greater detail below on the basis of examples and the figures.

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size to enable better illustration and/or to afford a better understanding.

FIG. 1 shows a schematic sectional illustration of a first example of a light-emitting diode. The light-emitting diode comprises a carrier 1. The carrier 1 comprises a baseplate 10 and also a reflector wall 11. Baseplate 10 and reflector wall 11 are formed integrally from a plastic, for example. The carrier 1 furthermore comprises electrical connection locations 9a, 9b formed, for example, by an electrically conductive carrier frame encapsulated by injection molding by the plastic that forms baseplate 10 and reflector wall 11.

The carrier 1 has a mounting surface 1a. The mounting surface 1a is subdivided into a chip window 8a in which a luminescence diode chip 2 is applied to the connection location 9a of the carrier 1 by solder 6 at the mounting surface 1a. Furthermore, the mounting surface 1a is subdivided into a wire window 8b in which a bonding wire 7 is electrically conductively connected to a connection location 9a of the carrier 1. The bonding wire 7 is electrically conductively connected to the light-emitting diode chip 2 by a bonding pad 7a arranged on the light-emitting diode chip 2. Furthermore, the mounting surface 1a comprises regions 8c of the baseplate 10 and of the connection locations 9a, 9b, respectively, the regions being covered by the reflective element 3.

The reflective element 3, which in this case is formed as a foil composed of porous polytetrafluoroethylene, is fixed to the mounting surface 1a by an adhesive 31 at exposed regions of the connection locations 9a, 9b. The reflective element 3 is fixed to the plastic of the carrier 1, for example, in the region of the reflector wall 11, by an adhesive 31 or in a manner free of bonding agent, for example, by hot pressing.

In this case, the reflector wall 11 completely laterally surrounds the light-emitting diode chip 2 and forms a cavity for the light-emitting diode chip 2. Electromagnetic radiation 4 emitted by the light-emitting diode chip 2 during operation is diffusely scattered by the reflective element 3. The light-emitting diode chip 2 and also the reflective element 3 can be potted with a potting body 5 composed of a radiation-transmissive material and are in direct contact with the latter. By way of example, the potting body 5 contains or consists of one of the following materials: silicone, epoxide, silicone-epoxide hybrid material.

In the case of the light-emitting diode as explained in greater detail in conjunction with FIG. 1, those regions 13 of the carrier 1 on which electromagnetic radiation 4 could impinge during operation of the light-emitting diode chip 2 and in which the outer surface of the carrier 1 is formed with a plastic are completely covered by the reflective element 3. Regions 12 on which no electromagnetic radiation of the light-emitting diode chip 2 can impinge are free of the reflective element 3.

Figure 2:
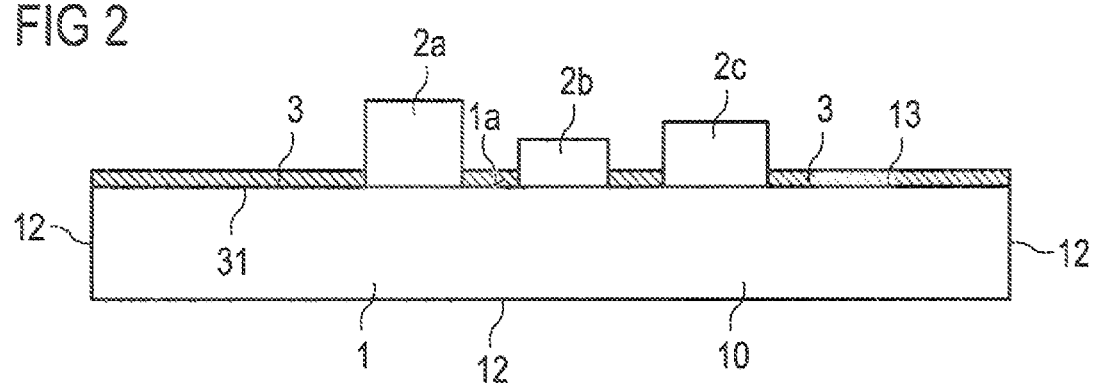

A further example of a light-emitting diode is explained in conjunction with FIG. 2. In this example, the carrier 1 is formed by a connection carrier which can be a printed circuit board, for example, which comprises an electrically insulating basic body, to which electrical connection locations and conductor tracks are applied. The region 13 of the carrier on which electromagnetic radiation can impinge during the operation of the light-emitting diode chips 2a, 2b, 2c is completely covered by the reflective element 3 which is once again a porous polytetrafluoroethylene foil.

The reflective element 3 can be mechanically connected to the carrier 1, for example, by an adhesive or in a manner free of bonding agent by hot pressing or insert molding of the reflective element 3 with the material of the carrier 1. Regions 12 on which no electromagnetic radiation of the light-emitting diode chips 2a, 2b, 2c can impinge are free of the reflective element 3.

The light-emitting diode in accordance with the example in FIG. 2 comprises three light-emitting diode chips 2a, 2b, 2c which can be suitable, for example, for generating blue, red and green light. The reflective element composed of porous polytetrafluoroethylene is distinguished by a high reflectivity of at least 98% for the light of each of the three light-emitting diode chips 2a, 2b, 2c.

In conjunction with FIG. 3A, a further example of a light-emitting diode is explained in greater detail on the basis of a schematic sectional illustration. In this example, the carrier 1 comprises a baseplate 10 which is free of a plastic in the regions 14 at its outer surface facing the light-emitting diode chips 2a, 2b, 2c.

By way of example, the baseplate 10 can be coated with a metal in the regions or the baseplate 10 is formed from a ceramic material to which conductor tracks and electrical connection locations are applied. The carrier 1 furthermore comprises the reflector wall 11 which laterally encloses the light-emitting diode chips 2a, 2b, 2c, and which is formed with a plastic.

All the regions 13 on which electromagnetic radiation of the light-emitting diode chips 2a, 2b, 2c can impinge are covered by the reflective element 3 which is embodied, for example, as a foil composed of porous polytetrafluoroethylene. In this case, the reflector wall 11 is also covered in regions which run parallel to the mounting surface 1a and on which, for example, stray radiation which can be reflected back from an optical element can impinge. In this case, it is also possible for the entire reflector wall 11 to be covered with the reflective element 3 completely in regions of its outer surface which are not directly connected to the baseplate 10. The reflective element 3 can be fixed, for example, by insert molding of the reflective element 3 with the material of the reflector wall 11 such that the reflective element 3 and reflector wall 11 are connected to one another in a manner free of bonding agent.

In conjunction with FIG. 3B, a further example of a light-emitting diode described here is explained in greater detail. In contrast to the example in FIG. 3A, the reflective element 3 is not a foil in this example. Rather, the reflective element 3 is a rigid insert part, the form of which is already adapted to the shaping of the reflector wall 11. That is to say that the reflective element 3 is a rigid, self-supporting body which, for the purpose of fixing, is inserted into the cavity enclosed by the reflector wall 11 and can be fixed to the reflector wall 11 and thus to a part of the carrier 1, for example, by adhesive bonding.

A further example of a light-emitting diode described here is explained in greater detail in conjunction with FIG. 4. In this example, the carrier 1 of the light-emitting diode comprises a baseplate 10. The baseplate 10 is a printed circuit board. By way of example, the baseplate 10 is formed from a ceramic material to which conductor tracks and electrical connection locations are applied. Furthermore, it is possible for the baseplate 10 to be a metal-core circuit board.

The carrier 1 furthermore comprises the reflector wall 11 laterally enclosing the light-emitting diode chips 2a, 2b, 2c. In the example described in conjunction with FIG. 4, the reflector wall 11 is the reflective element 3 and consists of porous polytetrafluoroethylene. That is to say that, in this example, the reflective element is a rigid, self-supporting body fixed onto a part of the carrier, namely the baseplate 10. By way of example, the reflector wall 11 is adhesively bonded onto the baseplate 10.

My light-emitting diodes and methods are not restricted to the examples by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A light-emitting diode comprising:
   a carrier having a mounting surface;
   at least one light-emitting diode chip fixed to the mounting surface; and
   a reflective element comprising porous polytetrafluoroethylene which reflects electromagnetic radiation and is fixed to the carrier at least in selected places in a manner free of bonding agent.

2. The light-emitting diode of claim 1, wherein the reflective element consists of a foil composed of porous polytetrafluoroethylene.

3. The light-emitting diode according to claim 1, wherein the reflective element is a rigid insert part which consists of porous polytetrafluoroethylene and is fixed to a reflector wall of the carrier, wherein the reflector wall laterally surrounds the at least one light-emitting diode chip; and
   all the regions of the outer surface of the carrier formed with a plastic and, on which electromagnetic radiation generated by the at least one light-emitting diode chip during operation of the at least one light-emitting diode chip can impinge, are covered by the reflective element.

4. The light-emitting diode according to claim 1, wherein the reflective element is a reflector wall composed of porous polytetrafluoroethylene fixed to a baseplate of the carrier, and
   all the regions of the outer surface of the carrier formed with a plastic, and on which electromagnetic radiation generated by the at least one light-emitting diode chip during operation of the at least one light-emitting diode chip can impinge, are covered by the reflective element.

5. The light-emitting diode according to claim 1, wherein the reflective element is a rigid insert part which consists of porous polytetrafluoroethylene and is fixed to a reflector wall of the carrier, wherein the reflector wall laterally surrounds the at least one light-emitting diode chip.

6. The light-emitting diode according to claim 1, wherein the reflective element is a reflector wall composed of porous polytetrafluoroethylene fixed to a baseplate of the carrier.

7. The light-emitting diode according to claim 1, wherein the reflective element covers all the regions of the outer surface of the carrier on which electromagnetic radiation generated by the at least one light-emitting diode chip during operation of the at least one light-emitting diode chip can impinge.

8. The light-emitting diode according to claim 1, wherein, during operation of the at least one light-emitting diode chip, no electromagnetic radiation generated by the at least one light-emitting diode chip impinges on the outer surface of the carrier.

9. The light-emitting diode according to claim 1, wherein all the regions of the outer surface of the carrier formed with a plastic and on which electromagnetic radiation generated by the at least one light-emitting diode chip during operation of the at least one light-emitting diode chip can impinge are covered by the reflective element.

10. The light-emitting diode according to claim 1, wherein all the regions of the outer surface of the carrier free of a plastic are free of the reflective element.

11. A method for producing a light-emitting diode according to claim 1, wherein the carrier comprises a thermoplastic at least in places and the reflective element is pressed onto the plastic, with melting of the plastic to be fixed to the carrier in a manner free of bonding agent.

12. A method for producing a light-emitting diode according to claim 1, wherein the carrier comprises a thermoplastic at least in places and the reflective element is insert-molded with the plastic to fix the reflective element to the carrier in a manner free of bonding agent.

13. A light-emitting diode comprising:
    a carrier having a mounting surface;
    at least one light-emitting diode chip fixed to the mounting surface; and
    a reflective element provided for reflecting electromagnetic radiation, wherein
    the reflective element is fixed to the carrier,
    the reflective element comprises porous polytetrafluoroethylene,
    the reflective element is a rigid insert part consisting of porous polytetrafluoroethylene and is fixed to a reflector wall of the carrier, wherein the reflector wall laterally surrounds the at least one light-emitting diode chip, and
    the reflective element is fixed to the carrier at least in places in a manner free of bonding agent.

14. The light-emitting diode according to claim 1, wherein the reflective element is in direct contact with the mounting surface of the carrier.

* * * * *